United States Patent [19]
Kielmeyer et al.

[11] Patent Number: 5,583,468
[45] Date of Patent: Dec. 10, 1996

[54] HIGH FREQUENCY TRANSITION FROM A MICROSTRIP TRANSMISSION LINE TO AN MMIC COPLANAR WAVEGUIDE

[75] Inventors: Ronald F. Kielmeyer, Tempe; Richard J. Christensen; Paul L. Brownlee, both of Mesa; William M. Vassar, Apache Junction, all of Ariz.

[73] Assignee: Motorola, Inc., Schaumburg, Ill.

[21] Appl. No.: 415,890

[22] Filed: Apr. 3, 1995

[51] Int. Cl.$^6$ .................................................. H01P 5/08
[52] U.S. Cl. .............................. 333/33; 333/247; 333/260
[58] Field of Search ........................... 333/33, 246, 247, 333/260; 257/664

[56] References Cited

U.S. PATENT DOCUMENTS

| | | | |
|---|---|---|---|
| 4,600,907 | 7/1986 | Grellman et al. | 333/246 |
| 4,626,805 | 12/1986 | Jones | 333/33 |
| 4,686,492 | 8/1987 | Grellmann et al. | 333/33 |
| 5,270,673 | 12/1993 | Fries et al. | 333/246 |
| 5,294,897 | 3/1994 | Notani et al. | 333/33 |
| 5,402,088 | 3/1995 | Pierro et al. | 333/260 X |

FOREIGN PATENT DOCUMENTS

| | | | |
|---|---|---|---|
| 117702 | 4/1992 | Japan | 333/33 |

*Primary Examiner*—Paul Gensler
*Attorney, Agent, or Firm*—Kevin A. Buford

[57] ABSTRACT

A high frequency transition (10) from a microstrip transmission line (57) to an MMIC coplanar waveguide (41) is provided. The microstrip transmission line (57) is representative of that typically encountered in a high frequency RF module on a first substrate (11). The MMIC coplanar waveguide (41) is representative of that encountered in low cost MMICs fabricated on a semiconductor substrate (56). An interface (15) couples the microstrip transmission line (57) to a mode converter (16). Mode converter (16) provides impedance mismatch compensation and coplanar waveguide propagation mode conditions for a connector coplanar waveguide (34) which connects from the first substrate (11) to the semiconductor substrate (56). An impedance transformer (40) provides additional impedance mismatch compensation on the semiconductor substrate (39) to complete the transition.

16 Claims, 4 Drawing Sheets

HIGH FREQUENCY TRANSITION FROM A MICROSTRIP TRANSMISSION LINE TO AN MMIC COPLANAR WAVEGUIDE

BACKGROUND OF THE INVENTION

This invention relates in general to microwave transitions, and more particularly, to transitions from a microstrip transmission line medium to a coplanar waveguide transmission line medium.

Microwave modules often combine discrete component circuits with microwave monolithic integrated circuits (MMICs). Microwave modules are also typically designed using microstrip transmission line as the preferred transmission line medium because of its structural simplicity, and because microstrip facilitates engineering and manufacturing operations such as assembly, tuning, and rework.

Integrating MMICs into such a module often does not require transitions from the microstrip in the module to the inputs and outputs of the MMICs at higher microwave frequencies. Typically, the more expensive MMICs designed to operate at these frequencies use microstrip, and wire bonding between the top conductors of the module microstrip and the MMIC microstrip.

MMICs are often the most expensive components in a module assembly and techniques for reducing their cost have been an important priority in their continued development. Many lower cost MMIC components which are commercially available, or designed for low cost fabrication processes rely on coplanar waveguide as a transmission line medium. Coplanar waveguide permits fabrication of MMIC transmission lines without the need for expensive or yield limiting process steps such as wafer thinning, and backside processing.

The use of coplanar waveguide MMICs in modules using microstrip design requires some low loss means of transitioning from microstrip in the module to coplanar waveguide on the MMIC. Such a means when reversed can transition from coplanar waveguide on the MMIC to microstrip in the module so that lower cost coplanar waveguide MMICs can be integrated into a microstrip module assembly.

Lower frequency transition techniques typically employ bondwires to connect the microstrip top conductor with the coplanar waveguide center strip directly from where the module substrate ends to where the MMIC substrate begins. Bondwires are also used to connect the coplanar waveguide outer conductor strips to the grounded module base plate. The module base plate also grounds the backside ground plane of the microstrip. The signal carrying conductors of both transmission lines are connected together with bondwires, as are the ground conductors of both transmission line types. At higher frequencies, the bondwire inductive reactances, become excessively high. Impedance mismatch due to high inductive reactances cause signal reflections which degrade microwave performance.

High frequency transitions from coplanar waveguide to microstrip exist in the form of coplanar waveguide test probes which are used in conjunction with structures on a microstrip MMIC to form a transition. Coplanar waveguide test probe transitions are not useful for microstrip modules in transitioning to coplanar waveguide MMICs.

Since newer MMIC processes are combining higher frequency devices with lower cost coplanar waveguide design, a high frequency transition from module microstrip to MMIC coplanar waveguide is required to enable the use of these lower cost MMICs in microstrip modules at higher frequencies. Such a high frequency transition should be well matched, so as to minimize mismatch loss, and easily produced with conventional assembly techniques.

DETAILED DESCRIPTION OF THE DRAWINGS

A microwave module using microstrip as a primary means of high frequency interconnection and one or more microwave monolithic integrated circuits (MMICs) formed on a semiconductor substrate using MMIC coplanar waveguide requires a structure for coupling between microstrip transmission line and MMIC coplanar waveguide. Conventional techniques which find use up to approximately 10.0 Ghz simply couple the microstrip transmission line top conductor to the MMIC coplanar waveguide center strip using one or more bondwires, and use bond wires or wrap-around ground techniques to couple the microstrip ground plane to the MMIC coplanar waveguide ground conductors. Beyond 10.0 Ghz, such conventional structures are limited in usefulness, primarily because of parasitic inductance effects which result in severe impedance mismatch loss. A high frequency transition is required to efficiently couple the microstrip transmission line and the MMIC coplanar waveguide at frequencies beyond 10 GHz. Such a high frequency transition from a microstrip transmission line to an MMIC coplanar waveguide is provided in the following.

Figure 1:
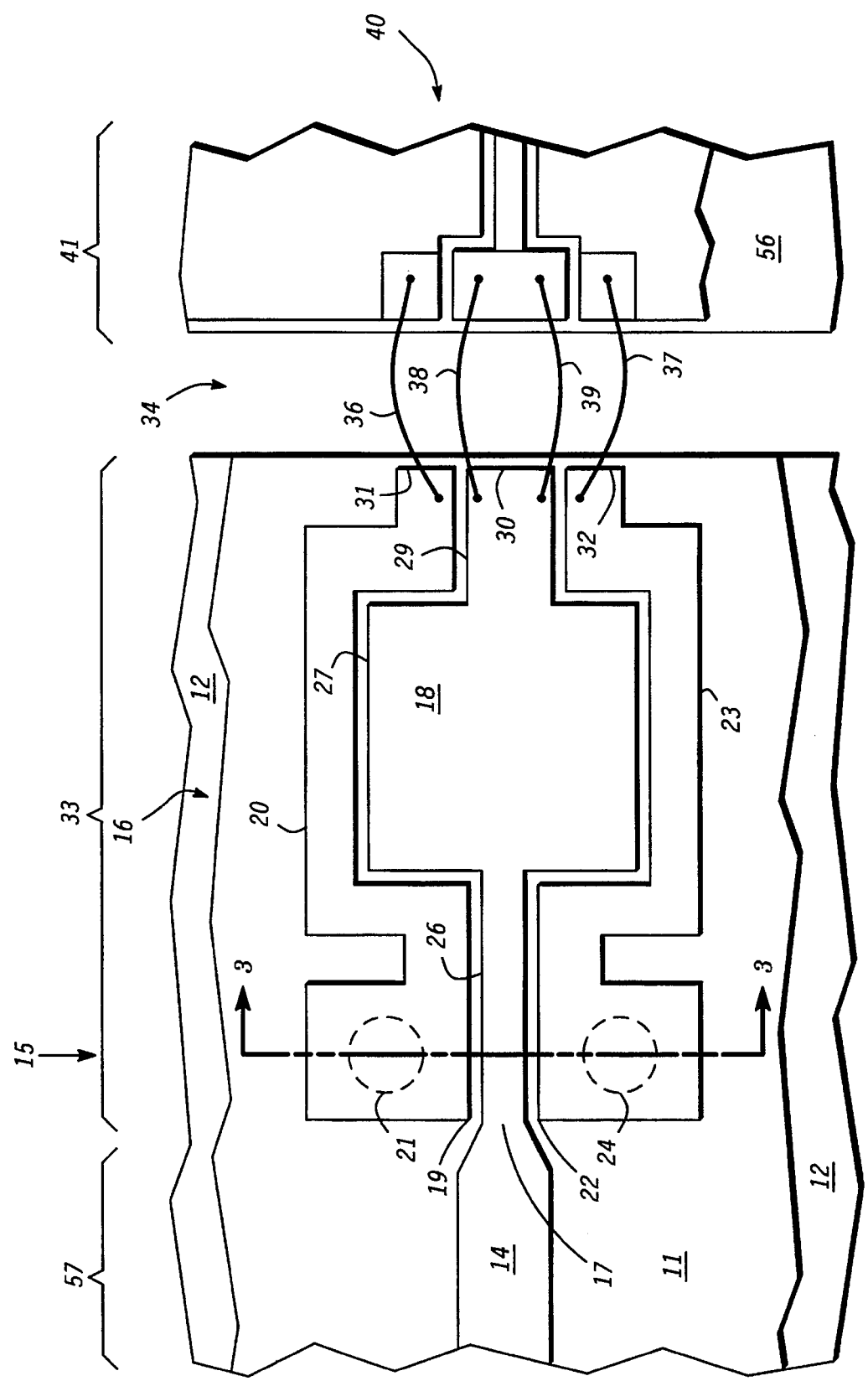
FIG. 1 is a top view of the high frequency transition.

FIG. 1 shows a top view of one embodiment of a high frequency transition 10.

Most of high frequency transition 10 is formed on a first substrate 11 with a first substrate ground plane 12 disposed below first substrate 11. First substrate 11 is representative of an inexpensive low dielectric constant material such as polytetrafluoroethylene (PTFE) which is widely used in microwave modules (not shown). Typically, the PTFE material is available with copper clad on two sides. Copper clad on one side is patterned, typically by etching processes, to form transmission lines and an opposite side is typically left unpatterned. The unpatterned side is commonly attached with solder or conductive epoxy to a module baseplate (not shown) which in use is typically grounded. The module base plate (not shown) supports first substrate 11. First substrate ground plane 12 is formed by the attachment of the unpatterned side of first substrate 11 and the module baseplate (not shown).

A microstrip transmission line 57 is formed on first substrate 11 over first substrate ground plane 12. Microstrip transmission line 57 is a well known form of transmission line commonly used to interconnect various parts of a microwave module. Microstrip transmission line 57 is formed by a microstrip top conductor 14 used as a signal conductor separated from ground plane 12 used as a ground conductor.

Hybrid coplanar waveguide comprises a center strip 18, and first and second ground conductors 20 and 23, all formed on first substrate 11 over first ground plane 12. Center strip 18 forms a signal conductor for hybrid coplanar waveguide 33, and first and second ground conductors 20 and 23 along with first substrate ground plane 12 form ground conductors for hybrid coplanar waveguide.

Hybrid coplanar waveguide 33 differs from a true coplanar waveguide (not shown) in two respects. Hybrid coplanar waveguide 33 includes a first ground plane 12 and first and second ground conductors 20 and 23 for ground conductors whereas a true coplanar waveguide includes only ground conductors. Also, first and second ground conductors 20 and 23 behave as transmission line strips with associated electrical lengths whereas true coplanar waveguide ground conductors ideally have infinite width and thus behave as ground planes. Hybrid coplanar waveguide 33 is actually three asymmetrical coupled microstrip transmission lines with two outside conductors grounded.

A mode converter 16 is formed by hybrid coplanar waveguide on first substrate 11. From this point on, center strip 18 is referred to as mode converter center strip 18, and first and second ground conductors 20 and 23 are referred to as first and second mode converter ground conductors 20 and 23.

Substrate vias 21 and 24, represented as dashed circles provide conductors for coupling first substrate ground plane 12 to both first mode converter ground conductors 20 and second mode converter ground conductor 23. Substrate vias 21 and 24 couple ground conductors of microstrip transmission line 57 and mode converter 16.

Microstrip top conductor 14 gradually narrows from an initial width associated with a system impedance, typically 50 ohms, to a width associated with a first segment 26 of mode converter center strip 18. Gradually narrowing width of microstrip top conductor 14 reduces impedance mismatch loss associated with changes in microstrip impedance. Integrating microstrip top conductor 14 with mode converter center strip 18 couples microstrip top conductor 14 to mode converter center strip 18. Integrating microstrip conductor 14 with mode converter center strip 18 couples signal conductors of microstrip transmission line 57 and mode converter 16.

Mode converter center strip 18 has three segments of varying width and length. The first segment 26 of mode converter center strip 18 is a narrow high impedance segment. First segment 26 contributes a series inductive reactance effect on impedance of mode converter 16. A second segment 27 of mode converter center strip 18 is a wide low impedance segment. Second segment 26 contributes a shunt capacitive reactance effect on impedance of mode converter 16. A third segment 29 is a narrow high impedance segment. Third segment 29 contributes a series inductive reactance effect on impedance of mode converter 16. First, second and third segments 26, 27, and 29 are high impedance and low impedance segments of mode converter center strip 18 which form an impedance transformation network using distributed elements.

Mode converter ground conductors 20 and 23 are strips which conform in shape with first, second, and third segments 26, 27, and 29 of mode converter center strip 18 so as to maintain a constant gap of separation between adjacent edges of mode converter center strip 18 and first and second mode converter ground conductors 20 and 23.

A feature of the present invention is that mode converter 16 provides necessary ground conductors and a center strip conductor for coupling mode converter 16 on first substrate 11 to coplanar waveguide.

A semiconductor substrate 56 is representative of the type of substrate used in the fabrication of lower cost MMICs which are not thinned and do not provide vias to connect through semiconductor substrate 56. Semiconductor substrate 56 and features on semiconductor substrate are illustrated to a larger scale than first substrate 11 and features on first substrate 11.

Typically, semiconductor substrate 56 is mounted to the same module baseplate as used in forming first substrate ground plane 12. Coplanar waveguide is commonly used for low cost MMICs as a transmission line medium. Substrate properties such as dielectric constant and thickness typically prevent the presence of ground plane 12 from influencing the electrical characteristics of a coplanar waveguide formed on semiconductor substrate 56. Mounting semiconductor substrate 56 to a module baseplate is not however a requirement for high frequency transition 10. Impedance transformer 40 on semiconductor substrate 56 is formed with a coplanar waveguide.

Conventional assembly connectors couple mode converter 16 on first substrate 11 to impedance transformer 40 on semiconductor substrate 56. In one embodiment of the invention, conventional assembly connectors such as bondwires form a connector coplanar waveguide 34 attached between mode converter 16 and impedance transformer 40.

Connector coplanar waveguide differs from true coplanar waveguide in that connector coplanar waveguide uses ground conductors of finite width instead of ideally infinite ground plane ground conductors. Ground conductors of connector coplanar waveguide 34 are formed by a first ground assembly connector or first ground bondwire 36, and a second ground assembly connector or second ground bondwire 37. An equivalent of a center strip of connector coplanar waveguide 34 is formed by a first center bondwire 38 and a second center bondwire 39. Alternate embodiments of the invention can make use of other forms of conventional assembly connectors forming a connector coplanar waveguide, including conductive ribbon bond connectors, or printed conductors on forms of high density interconnect technology intended for semiconductor interconnects.

Figure 2:
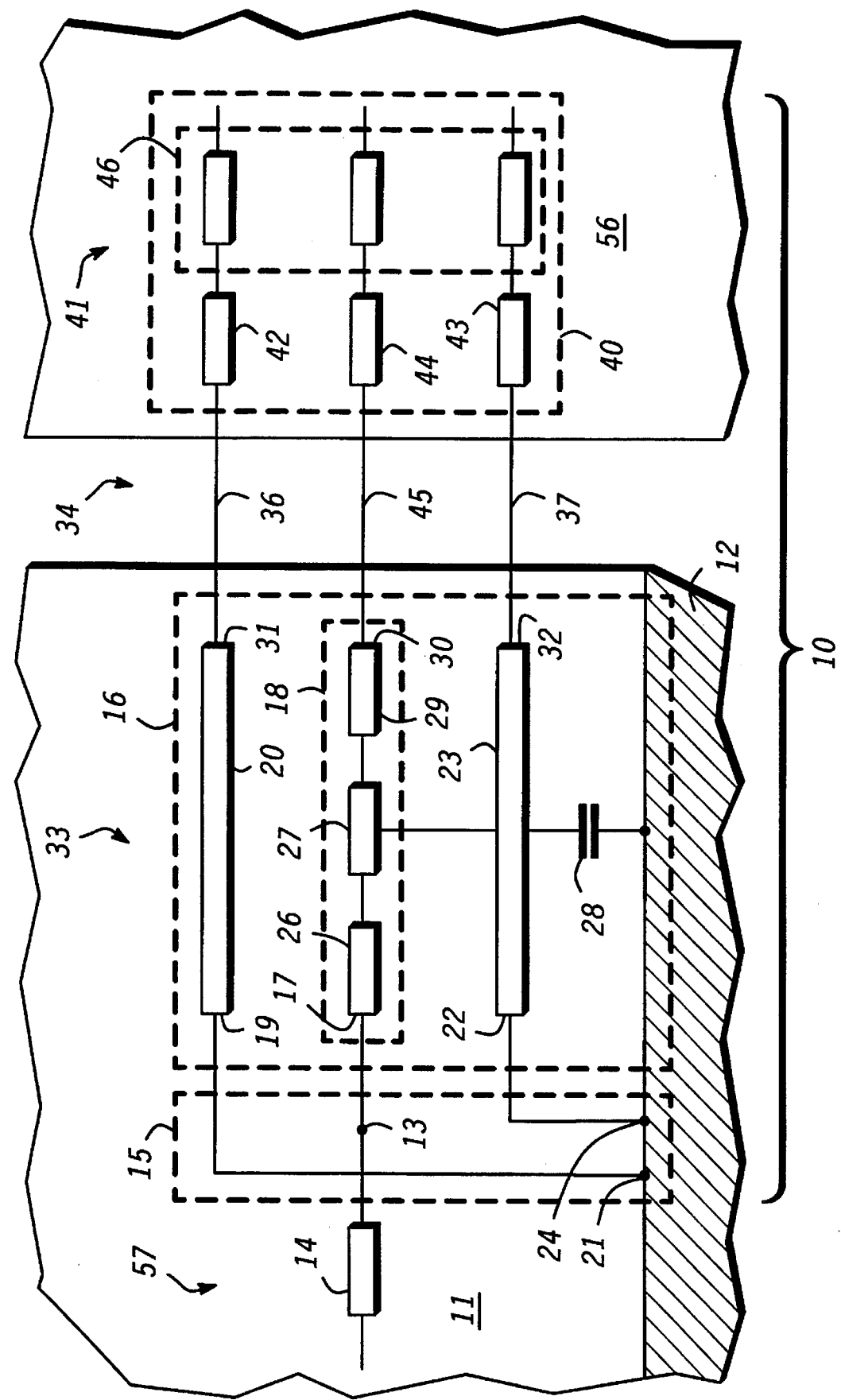
FIG. 2 is a schematic of the high frequency transition.

FIG. 2 is a schematic representation of high frequency transition 10 which illustrates the method of transitioning from microstrip transmission line 57 to an MMIC coplanar waveguide 41 on semiconductor substrate 56. Interface 15 on the first substrate is shown with connections for coupling microstrip top conductor 14 to an interface end 17 of a first segment 26 of mode converter center strip 18 with a connection 13. As shown in FIG. 1, connection only indicates that microstrip top conductor 14 and mode converter center strip 18 form a continuous strip. Microstrip top conductor 14 in an alternate embodiment may also be capacitively coupled with mode converter center strip 18 if a DC blocking requirement were necessary between microstrip transmission line 57 and mode converter 16.

Interface 15 is also shown coupling first substrate ground plane 12 with first and second mode converter ground conductors 20 and 23 using connections 21 and 24 respectively. Connections 21 and 24 represent substrate vias 21 and 24 shown in dashed lines in FIG. 1. Line 3—3 of FIG. 1 shows a section line, referred to below with reference to FIG. 3.

As shown in FIG. 2, interface 15, by coupling signal conductors of microstrip transmission line 57 with hybrid coplanar waveguide 33 forming mode converter 16, and by coupling ground conductors of microstrip transmission line 57 and hybrid coplanar waveguide 33 forming mode converter 16, provides necessary conditions for allowing high frequency wave propagation to take place between microstrip transmission line 57 and mode converter 16.

An important feature of the present invention is that high frequency transition 10 utilizes mode converter 16. Mode converter 16 provides efficient coupling to connector coplanar waveguide 34 by compensating for impedance mismatch effects due to connector coplanar waveguide 34. Mode converter 16 does so by forming an impedance transformation network using mode converter center strip 18 forming distributed elements.

Mode converter 16 on first substrate 11 is coupled to microstrip transmission line 57 by interface 15. Mode converter center strip 18 is formed of first, second, and third segments 26, 27 and 29. First segment 26 is a narrow high impedance segment which contributes a series inductive reactance effect on the impedance of mode converter 16. Second segment 27 is a wide low impedance segment which behaves as a top plate conductor for a shunt capacitor 28, with first substrate ground plane 12 behaving as a bottom plate. Second segment 27 provides a shunt capacitive reactance effect on the impedance of mode converter 16. Third segment 29 is a narrow high impedance segment which contributes series inductive reactance to mode converter 16 impedance.

Altering width and length dimensions of first, second and third segments 26,27 and 28 of mode converter center strip 18 between interface 15 and first substrate end 30 alters impedances of the segments forming an impedance transformation network using distributed elements. The impedance transformation network is formed by mode converter center strip 18 to compensate for impedance mismatch effects due to connector coplanar waveguide 34. Compensating for impedance mismatch effects due to connector coplanar waveguide 34 using mode converter 16 minimizes mismatch loss between microstrip transmission line 5 and connector coplanar waveguide 34.

Third segment 29 is included to provide a narrow first substrate end 30 of mode converter center strip 18 for an equivalent center strip 45 of connector coplanar waveguide 34.

The additional series inductive reactance provided by third segment 29 is not typically desirable. Third segment 29 is kept to a minimum length as necessary for maintenance of hybrid coplanar waveguide 33 structure, and assembly requirements for conventional assembly connectors used in forming connector coplanar waveguide 34.

First and second mode converter ground conductors 20 and 23 are substantially one half of a wavelength in electrical length between interface 15 and first substrate ends 31 and 32 of first and second mode converter ground conductors 20 and 23, respectively.

An important feature of the present invention is that first and second mode converter ground conductors 20 and 23, being substantially one half of a wavelength in electrical length, transfer equal ground potentials to first substrate ends 31 and 32 of first and second mode converter ground conductors 20 and 23 from interface 15. Equal ground potentials are transferred to first substrate ends 31 and 32 to establish conditions to support coplanar waveguide propagation mode in connector coplanar waveguide 34 without the need for substrate vias at first substrate ends 31 and 32 of mode converter ground conductors 20 and 23. Establishing coplanar waveguide mode of wave propagation for connector coplanar waveguide 34 efficiently couples connector coplanar waveguide 34 with mode converter 16.

Another feature of the present invention is that mode converter ground conductors 20 and 23, conform to the shape of mode converter center strip 18. First and second mode converter ground conductors 20 and 23 meander from interface 15 to first substrate ends 31 and 32 because they conform to the shape of mode converter center strip 18 and thereby provide an electrical length of one half of a wavelength within a shorter physical distance than if they were straight.

Impedance transformer 40 on semiconductor substrate 56 includes bond pads 42, 43, and (44 also shown in FIG. 4) in a configuration forming an MMIC coplanar waveguide. First and second ground bond pads 42 and 43 are located on either side of a center bond pad 44. Dimensions of first and second ground bond pads 42 and 43 and center bond pad 44 are compatible with conventional RF probing techniques and assembly requirements and assembly requirements such as for manufacturing bonding techniques.

MMIC coplanar waveguide impedance resulting from dimensions of bond pads 42, 43, and 44 most likely will not match a typical system impedance of 50 ohms. Dimensions of bond pads 42, 43, and 44 result in a low impedance with a shunt capacitive effect. A high impedance section 46 of MMIC coplanar waveguide 41 compensates for the low impedance presented by bond pads 42, 43, and 44. Compensating for the low impedance presented by MMIC bond pads 42, 43, and 44, using a high impedance section of MMIC coplanar waveguide 41 minimizes the effects of impedance mismatch loss.

Connector coplanar waveguide 34 couples first substrate ends 31 and 32 of first and second mode converter ground conductors 20 and 23 to first ground bond pad 42 and second ground bond pad 43 respectively of impedance transformer 40 using first ground bondwire 36 and second ground bondwire 37.

Connector coplanar waveguide 34 also couples first substrate end 30 of mode converter center strip 18 to center bond pad 44 of impedance transformer 40 using an equivalent connector coplanar waveguide center strip 45. Equivalent connector coplanar waveguide center strip 45 is shown in one embodiment shown in FIG. 1 as two bondwires 38 and 39.

Connector coplanar waveguide 34 shown in FIG. 2 may be formed by any suitable conventional assembly connectors. The equivalent connector coplanar waveguide center conductor 45 is not necessarily made up of two bondwires, but must be formed using one or more assembly connectors.

Figure 3:
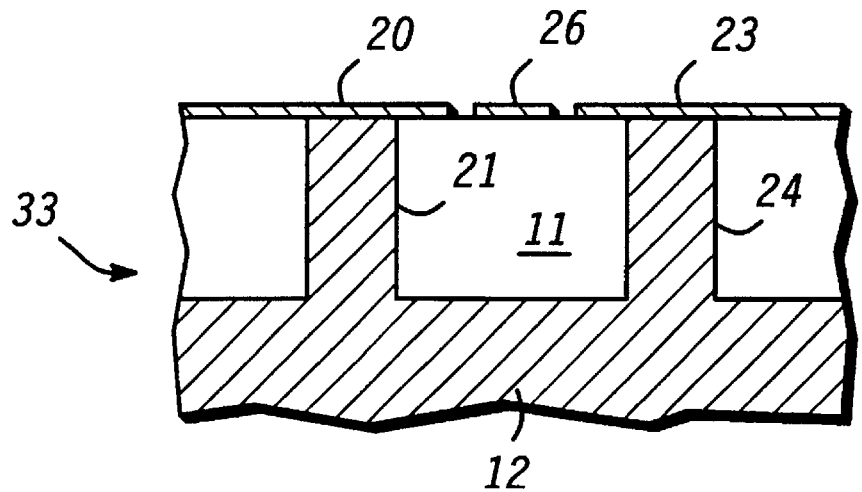
FIG. 3 is a cutaway view of the interface.

FIG. 3 shows a cutaway view of interface 15 through section line 3—3 of FIG. 1 illustrating the manner in which substrate vias 21 and 24 couple ground conductors of microstrip transmission line 57, first substrate ground plane 12, and hybrid coplanar waveguide 33 ground conductors, first and second mode converter ground conductors 20 and 23, through first substrate 11. First segment 26 of mode converter center strip 18 is also shown for reference.

Figure 4:
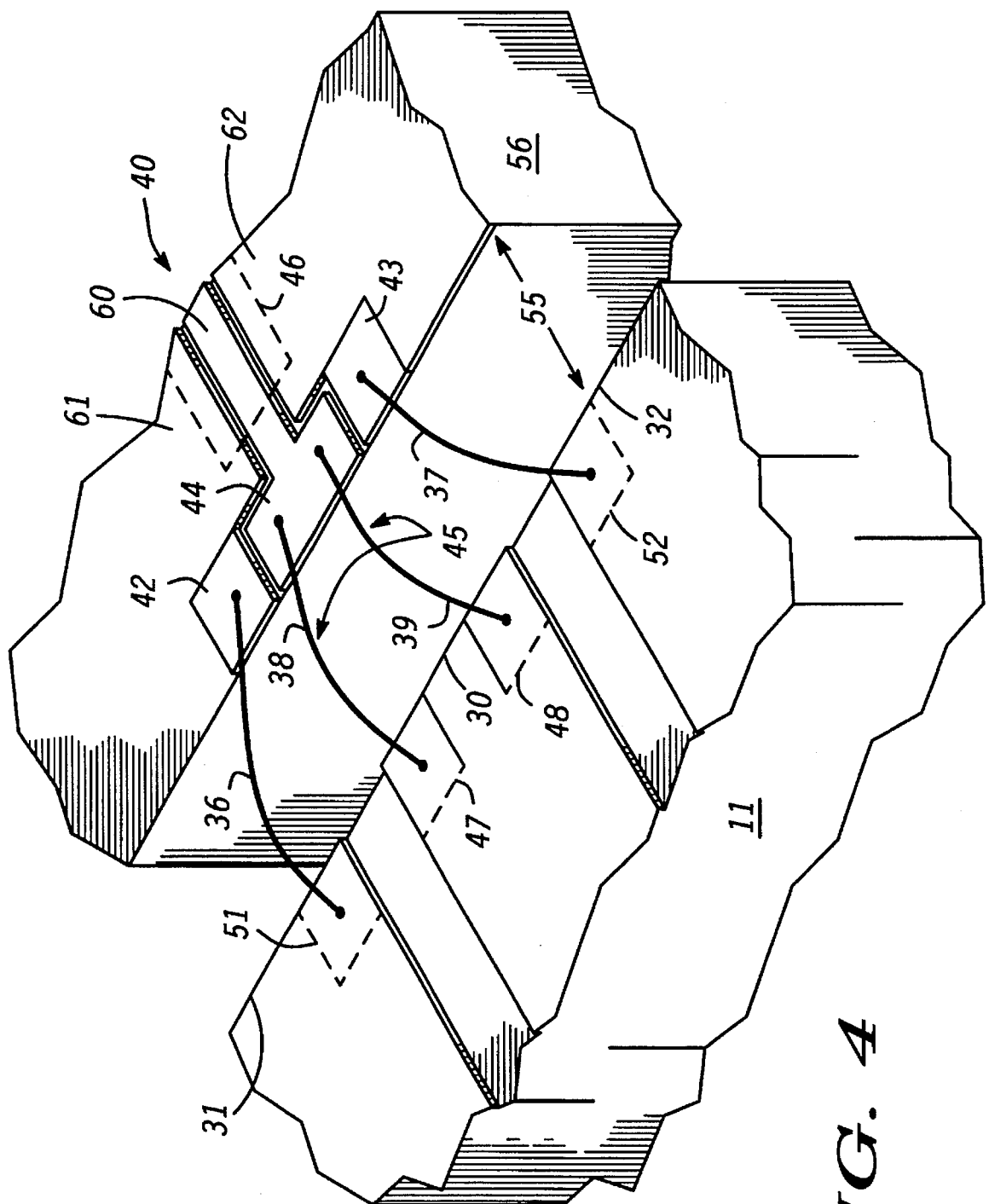
FIG. 4 is an isometric view showing bondwire connections from the first substrate to the semiconductor substrate.

FIG. 4 illustrates the method of coupling first substrate ends 30, 31, and 32 of mode converter center strip 18 and first and second mode converter ground conductors 20 and 23 to center bond pad 44 and first and second ground bond pads 42 and 43, respectively. It should be noted that FIG. 4 illustrates features on first substrate 11 and semiconductor substrate 56 with an accurate relative scale. The features on semiconductor substrate 56 are typically much smaller than features on first substrate 11. Bondwires forming connector coplanar waveguide 34 converge from mode converter 16 to impedance transformer 40. The impedance presented by connector coplanar waveguide 34 is determined by the dimensions of first substrate ends 30, 31, and 32 of mode converter center strip 18 and first and second mode converter ground conductors 20 and 23, a separation 55 between first substrate 11 and semiconductor substrate 56, and dimensions of bond pads 42, 43 and 44 of impedance transformer 40.

Connector coplanar waveguide 34 impedance is typically not controlled to match a typical system impedance of 50 ohms. Since connector coplanar waveguide is formed of conventional assembly connectors, with a very low dielectric constant between center bondwires 38 and 39 and ground bondwires 36 and 37, a high impedance of connector coplanar waveguide 34 results from the weak coupling between center bondwires 38 and 39 and ground bondwires 36 and 37.

The impedance transformation network formed by mode converter center strip 18 (see FIG. 2) features a large shunt capacitive reactance. Capacitor 28 contributes a large shunt capacitive reactance compensating for a large series inductive reactance, and thus the effects of impedance mismatch due to connector coplanar waveguide 34.

The dimensions of first, second and third segments 26, 27, and 29 (see FIG. 1) are determined by the impedance presented by connector coplanar waveguide 34. Connector coplanar waveguide 34 can be electrically characterized either through measurements, calculation, or simulation techniques. Requirements for compensation can be reduced to a network with series inductance elements and one or more shunt capacitance elements. Dimensions for first, second, and third segments 26, 27, and 29 can then be synthesized.

A feature of the preferred embodiment of the present invention is that mode converter 16 which establishes equal ground potentials at first substrate ends 31 and 32 of mode converter ground conductors 20 and 23 does so without using substrate vias at first substrate ends 31 and 32. First and second ground bondwires 36 and 37 can be attached at first substrate ends 31 and 32 without mechanical interference from substrate vias.

FIG. 4 shows locations of bondwires 36, 37, 38, and 39 relative to first substrate edges 30, 31, and 32. Coplanar waveguide mode of wave propagation concentrates current densities along the opposite lengthwise edges of a coplanar waveguide center strip 60. Currents of equal magnitude and opposite phase are concentrated along the adjacent lengthwise edges of coplanar waveguide ground conductors 61 and 62. Connecting first center bondwire 38 to a first edge 47 of first substrate end 30 (part of mode converter center strip), and connecting second center bond wire 39 to a second edge 48 of first substrate end 30, makes use of the current distribution due to coplanar waveguide mode of wave propagation. The connections of bondwires 38 and 39 to first and second edges 47 and 48 are to be made as closely as assembly techniques allow to the outside lengthwise edges of first substrate end 30 to minimize the reactance associated with the connection and minimize reflective loss.

For similar reasons, connecting first ground bondwire 36 to an adjacent edge 51 of first substrate end 31 (part of first mode converter ground conductor), and connecting second ground bondwire 37 to an adjacent edge 52 of first substrate end (part of second mode converter ground conductor), as closely to adjacent edges as assembly techniques allow, minimizes connection relective loss.

Connector coplanar waveguide is shown connecting to bond pads 42, 43, and 44 on semiconductor substrate 56. High impedance section 46, compensating for the low impedance presented by bond pads 42, 43, and 44 is also shown.

Figure 5:
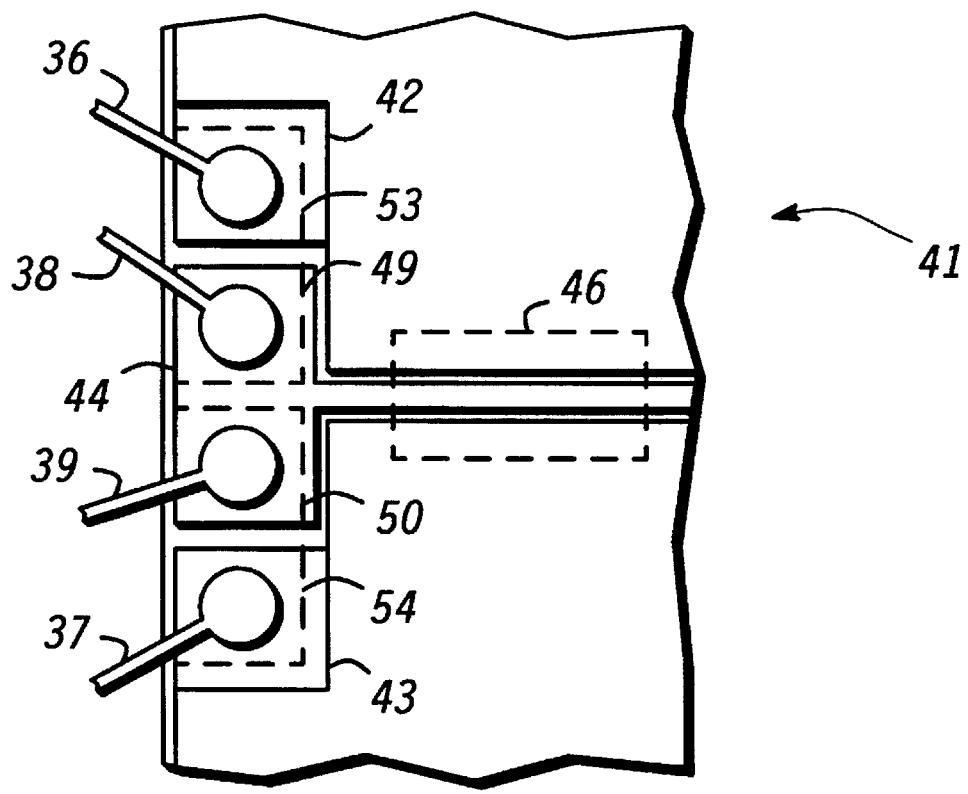
FIG. 5 is a top view of the parts of the transition on the semiconductor substrate.

FIG. 5 shows a top view of bondwires 36, 37, 38 and 39 connecting to bond pads 42, 43, and 44 of impedance transformer 40. First center bond wire 38 connects to center of first side 49 of center bond pad 44 and second center bond wire 39 connects with center of second side 50 of center bond pad 44.

First ground bond wire 36 and second ground bondwire 37 connect to center of first ground bond pad 53 and center of second ground bond pad 54. Connecting first and second ground bondwires 36 and 37 as closely as assembly techniques allow to first and second ground bond pad centers 53 and 54 minimizes connection reflective losses.

Bond pads 42, 43, and 44 present a low impedance because of bond pad dimensions. Compensating for the low impedance presented by bond pads 42, 43, and 44 is accomplished with high impedance section 46 of MMIC coplanar waveguide 41.

By now it should be appreciated, that high frequency transition 10 (see FIG. 1) provides a low loss means for coupling from microstrip transmission line 57 on a first substrate 11, which is typical of substrates used in microwave modules, to MMIC coplanar waveguide on a semiconductor substrate 56. It should also be appreciated that conventional assembly techniques apply throughout which render high frequency transition 10 as readily manufactured as conventional lower frequency means for coupling microstrip transmission line 57 to MMIC coplanar waveguide.

We claim:

1. A high frequency transition from microstrip transmission line on a first substrate to a microwave monolithic integrated circuit (MMIC) coplanar waveguide on a second substrate comprised of:

a first substrate ground plane disposed below a first substrate;

a microstrip transmission line formed on the first substrate over the first substrate ground plane;

a microstrip transmission-line-to-coplanar waveguide mode converter on the first substrate;

an interface on the first substrate, wherein the interface includes means for coupling said microstrip transmission line to a center strip of the mode converter to couple signal conductors of the microstrip transmission line and the mode converter and further includes a first substrate via to couple the first substrate ground plane to a first mode converter ground conductor, and a second substrate via to couple the first substrate ground plane to a second mode converter ground conductor, thereby coupling ground conductors of the microstrip transmission line and the mode converter;

an impedance transformer formed on a second, semiconductor, substrate by a MMIC coplanar waveguide; and a connector coplanar waveguide which couples the mode converter on the coplanar waveguide of the first substrate with the impedance transformer on the semiconductor substrate.

2. The high frequency transition of claim 1 wherein the connector coplanar waveguide further includes ground conductors formed by bondwires in which a first ground bondwire connects a first mode converter ground conductor with a first ground bond pad of the impedance transformer, and a second ground bondwire connects a second mode converter ground conductor with a second ground bond pad of the impedance transformer.

3. The high frequency transition of claim 2 wherein the connector coplanar waveguide further includes an equivalent of a coplanar waveguide center strip formed by bondwires in which a first center bondwire connects a first edge of a first substrate end of a mode converter center strip with a center of a first side of a center bond pad of the impedance transformer, and a second center bondwire connects a second edge of a first substrate end of the mode converter center strip with a center of a second side of the center bond pad of the impedance transformer.

4. The high frequency transition of claim 1 wherein the impedance transformer further includes bond pads, for bondwires forming the connector coplanar waveguide and coplanar waveguide measurement probes, connected to a high impedance section of the MMIC coplanar waveguide, which compensates for impedance mismatch effects due to the bond pads.

5. A high frequency transition from microstrip transmission line on a first substrate to a microwave monolithic integrated circuit (MMIC) coplanar waveguide on a second substrate comprised of:

a first substrate ground plane disposed below a first substrate;

a microstrip transmission line formed on the first substrate over the first substrate ground plane;

an interface on the first substrate;

a microstrip transmission-line-to-coplanar waveguide mode converter on the first substrate coupled to the microstrip transmission line by the interface;

an impedance transformer formed on a second semiconductor substrate by a MMIC coplanar waveguide; and a connector coplanar waveguide which couples the mode converter on the coplanar waveguide of the first substrate with the impedance transformer on the semiconductor substrate, wherein the mode converter further includes an impedance transformation network to compensate for impedance mismatch effects due to the connector coplanar waveguide, between the interface and a first substrate end of the mode converter, made up of high impedance and low impedance center strip segments of said mode converter.

6. The high frequency transition of claim 5 wherein the mode converter further includes a first mode converter ground conductor and a second mode converter ground conductor which are substantially one half of a wavelength in electrical length.

7. A method of transitioning from a microstrip transmission line on a first substrate to an MMIC coplanar waveguide on a second, semiconductor, substrate, comprising the steps of:

forming a mode converter on the first substrate using a hybrid coplanar waveguide;

coupling the microstrip transmission line to the mode converter through an interface;

forming an impedance transformer including bond pads on the semiconductor substrate using the MMIC coplanar waveguide;

coupling the mode converter on the first substrate with the bond pads of the impedance transformer on the semiconductor substrate using a connector coplanar waveguide;

establishing a coplanar waveguide mode of wave propagation for, and compensating for impedance mismatch effects due to, the connector coplanar waveguide using the mode converter;

compensating for impedance mismatch effects of the bond pads on the semiconductor substrate to which the connector coplanar waveguide couples, using the impedance transformer;

forming the interface by coupling a first interface end of a first mode converter ground conductor to a first substrate ground plane using a first substrate via; and coupling a second mode converter ground conductor to the first substrate ground plane using a second substrate via, thereby coupling ground conductors of, and allowing high frequency wave propagation to take place between, the microstrip transmission line and the mode converter.

8. The method of claim 7 including forming the interface by coupling a microstrip top conductor to an interface end of a mode converter center strip, thereby coupling signal conductors of, and allowing high frequency wave propagation to take place between, the microstrip transmission line and the mode converter.

9. The method of claim 7 including forming a connector coplanar waveguide using connectors to connect between first substrate ends of the mode converter and semiconductor substrate ends of the impedance transformer.

10. The method of claim 9 including forming a first ground conductor of the connector coplanar waveguide by connecting a first substrate end of a first mode converter ground conductor with a first ground bond pad of the impedance transformer using a first ground assembly connector, and forming a second ground conductor of the connector coplanar waveguide by connecting a first substrate end of a second mode converter ground conductor with a second ground bond pad of the impedance transformer using a second ground assembly connector.

11. The method of claim 9 including forming an equivalent of a center strip of the connector coplanar waveguide by connecting a first substrate end of a mode converter center strip with a center bond pad of the impedance transformer using connectors which connect a first edge of a first substrate end of the mode converter center strip with a center of a first side of the center bond pad, and connect a second edge of the first substrate end of the mode converter center strip with a center of a second side of the center bond pad.

12. The method of claim 7 including forming the impedance transformer with the MMIC coplanar waveguide using a first ground bond pad, a second ground bond pad, and a center bond pad and using a high impedance section of MMIC coplanar waveguide for compensating for impedance mismatch effects due to bond pads.

13. A method of transitioning from a microstrip transmission line on a first substrate to an MMIC coplanar waveguide on a second, semiconductor, substrate, comprising the steps of:

forming a mode converter on the first substrate using a hybrid coplanar waveguide;

coupling the microstrip transmission line to the mode converter through an interface;

forming an impedance transformer including bond pads on the semiconductor substrate using the MMIC coplanar waveguide;

coupling the mode converter on the first substrate with the bond pads of the impedance transformer on the semiconductor substrate using a connector coplanar waveguide;

establishing a coplanar waveguide mode of wave propagation for, and compensating for impedance mismatch effects due to, the connector coplanar waveguide using the mode converter; and compensating for impedance mismatch effects of the bond pads on the semiconductor substrate to which the connector coplanar waveguide couples, using the impedance transformer, including forming the mode converter by altering width and length dimensions of segments of a center strip of the mode converter, thereby forming an impedance transformation network using distributed elements for compensating for impedance mismatch effects of the connector coplanar waveguide.

14. The method of claim 13 including forming the mode converter having an electrical length of one half of a wavelength, between the interface and a first substrate end of a first mode converter ground conductor and a second mode converter ground conductor, thereby establishing equal ground potentials at first substrate ends of the first mode converter ground conductor and the second mode converter ground conductor.

15. A microstrip transmission line and a coplanar waveguide in combination, the microstrip transmission line comprising:
a first substrate having a first surface and an opposite second surface;
a first substrate ground plane disposed on the first surface of the first substrate;
a microstrip transmission line formed on the second surface of the first substrate;
a transmission-line-to-coplanar waveguide mode converter comprising a first center strip coupled to the microstrip transmission line and first and second ground conductors on first and second sides of the first center strip, all formed on the second surface of the first substrate;

the coplanar waveguide comprising:
a second center strip and third and fourth coplanar waveguide ground conductors on first and second sides of the second center strip, all formed on a second, semiconductor, substrate; and the microstrip transmission line and the coplanar waveguide being connected by a connector coplanar waveguide which couples the first center strip and the first and second ground connectors of the transmission-line-to-coplanar waveguide mode converter with the second center strip and the third and fourth ground conductors respectively of the coplanar waveguide, wherein the first and second ground conductors are approximately one half of a wavelength in electrical length.

16. The microstrip transmission line and coplanar waveguide of claim 15, wherein the center strip of the mode converter comprises an impedance transformation network of distributed elements.

* * * * *